(12) United States Patent
Shigeta et al.

(10) Patent No.: US 11,818,840 B2
(45) Date of Patent: Nov. 14, 2023

(54) PRINTED WIRING BOARD AND ELECTRONIC DEVICE

(71) Applicant: Mitsubishi Electric Corporation, Tokyo (JP)

(72) Inventors: Koji Shigeta, Tokyo (JP); Masato Morita, Tokyo (JP); Hironobu Fukushima, Tokyo (JP); Masahiro Koyama, Tokyo (JP); Naoki Matsumoto, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 352 days.

(21) Appl. No.: 17/419,813

(22) PCT Filed: Mar. 25, 2019

(86) PCT No.: PCT/JP2019/012459
§ 371 (c)(1),
(2) Date: Jun. 30, 2021

(87) PCT Pub. No.: WO2020/194440
PCT Pub. Date: Oct. 1, 2020

(65) Prior Publication Data
US 2022/0087018 A1    Mar. 17, 2022

(51) Int. Cl.
*H05K 1/11* (2006.01)
*H05K 1/02* (2006.01)
*H05K 3/34* (2006.01)

(52) U.S. Cl.
CPC .......... *H05K 1/111* (2013.01); *H05K 1/0218* (2013.01); *H05K 3/34* (2013.01)

(58) Field of Classification Search
CPC ......... H05K 1/111; H05K 1/0218; H05K 3/34
See application file for complete search history.

(56) References Cited

U.S. PATENT DOCUMENTS

2003/0056975 A1* 3/2003 Kochanowski ........ H05K 1/111
                                                174/250
2005/0173151 A1* 8/2005 Shepherd ............... H05K 1/114
                                                174/250
(Continued)

FOREIGN PATENT DOCUMENTS

JP    58-175668 U    11/1983
JP    59-127267 U    8/1984
(Continued)

OTHER PUBLICATIONS

International Search Report of the International Searching Authority dated May 14, 2019 for the corresponding International application No. PCT/JP2019/012459 (and English translation).

*Primary Examiner* — Hoa C Nguyen
(74) *Attorney, Agent, or Firm* — POSZ LAW GROUP, PLC

(57) ABSTRACT

A printed wiring board includes an electrode pad to be soldered to an electrode of an electronic component, an electrode pad to be soldered to an electrode of the electronic component, a barrier conductor continuous with the electrode pad, and a barrier conductor continuous with the electrode pad, the barrier conductor and the barrier conductors are located at positions facing each other with a gap area therebetween, the barrier conductor and the electrode pads are positioned such that the electrode pad faces the gap area with the barrier conductor therebetween and that the electrode pad faces the gap area with the barrier conductor therebetween, and the gap area is an area in which an adhesive is placed when adhering the electronic component.

7 Claims, 6 Drawing Sheets

(56) References Cited

U.S. PATENT DOCUMENTS

| | | | |
|---|---|---|---|
| 2005/0253231 A1* | 11/2005 | Liu | H05K 3/3452 |
| | | | 257/E23.125 |
| 2007/0007323 A1* | 1/2007 | Russell | H05K 3/303 |
| | | | 228/246 |
| 2017/0138632 A1* | 5/2017 | Marco | F28F 19/00 |
| 2017/0280565 A1* | 9/2017 | Tso | H05K 3/3452 |
| 2019/0013285 A1* | 1/2019 | Murayama | H05K 1/181 |

FOREIGN PATENT DOCUMENTS

| | | |
|---|---|---|
| JP | 08-037365 A | 2/1996 |
| JP | 2007-305904 A | 11/2007 |

* cited by examiner

PRINTED WIRING BOARD AND ELECTRONIC DEVICE

CROSS REFERENCE TO RELATED APPLICATION

This application is a U.S. national stage application of PCT/JP2019/012459 filed on Mar. 25, 2019, the contents of which are incorporated herein by reference.

FIELD

The present invention relates to a printed wiring board to which an electrode of an electronic component is soldered, and an electronic device.

BACKGROUND

One of the methods for soldering an electronic component onto a printed wiring board is a soldering method called mixed mounting. In this method, an adhesive is applied to one side of a printed wiring board, and a surface mount component is placed on the adhesive to be temporarily fixed. Subsequently, the printed wiring board is turned back, an electronic component lead (insertion component) is inserted into a through-hole from the other side of the printed wiring board, and the surface mount component and the insertion component are together subjected to wave soldering. Thus, in mixed mounting, because the surface mount component in the upside-down state needs to be brought in contact with the jet solder, the application of the adhesive and the temporary fixing of the electronic component are necessary.

In this mixed mounting, when the surface mount component is placed on the adhesive, the adhesive may be extruded and spread out over the electrode pads on the printed wiring board as a result of the surface mount component pressing and spreading the adhesive. In this case, the adhesive enters between the electrodes of the surface mount component and the electrode pads of the printed wiring board, which causes hindering of soldering (metal junction), and thus lowers the soldering quality of the printed wiring board.

A printed wiring board described in Patent Literature 1 includes frame-like copper foil between electrode pads so as to prevent an adhesive from spreading.

CITATION LIST

Patent Literature

Patent Literature 1: Japanese Utility Model Application Laid-open No. S58-175688

SUMMARY

Technical Problem

With the technology of Patent Literature 1, however, because the frame-like copper foil is formed between the electrode pads, there is a problem in that a short circuit is likely to occur between the electrode pads via the frame-like copper foil during soldering.

The present invention has been made in view of the above, and an object thereof is to provide a printed wiring board capable of stopping spreading of an adhesive while preventing a short circuit between electrode pads.

Solution to Problem

To solve the above problems and achieve the object, a printed wiring board according to the present invention includes: a first electrode pad to be soldered to a first electrode of an electronic component; a second electrode pad to be soldered to a second electrode of the electronic component; a first barrier conductor continuous with the first electrode pad; and a second barrier conductor continuous with the second electrode pad, wherein the first barrier conductor and the second barrier conductor are located at positions facing each other with an adhesive area therebetween, and the first electrode pad and the second electrode pad are positioned such that the first electrode pad faces the adhesive area with the first barrier conductor therebetween and that the second electrode pad faces the adhesive area with the second barrier conductor therebetween, the adhesive area being an area for an adhesive to be placed for adhesion of the electronic component.

Advantageous Effects of Invention

A printed wiring board according to the present invention produces an effect of being capable of stopping spreading of an adhesive while preventing a short circuit between electrode pads.

DESCRIPTION OF EMBODIMENTS

A printed wiring board and an electronic device according to embodiments of the present invention will be described in detail below with reference to the drawings. Note that the present invention is not limited to the embodiments.

First Embodiment

Figure 1:
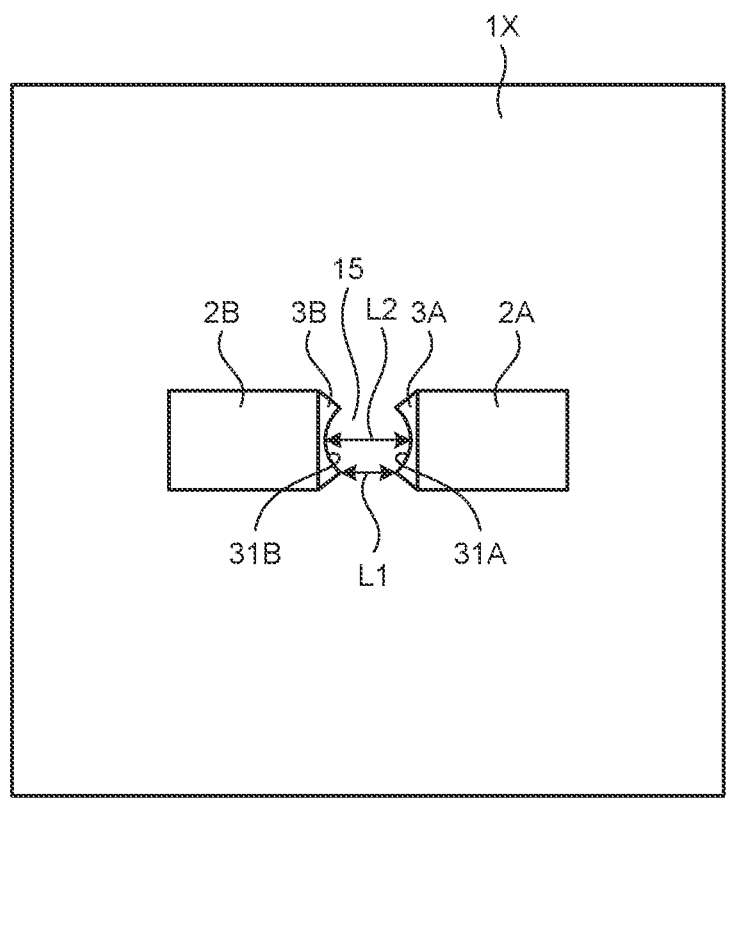
FIG. 1 is a top view illustrating a configuration of a printed wiring board according to a first embodiment.
Figure 2:
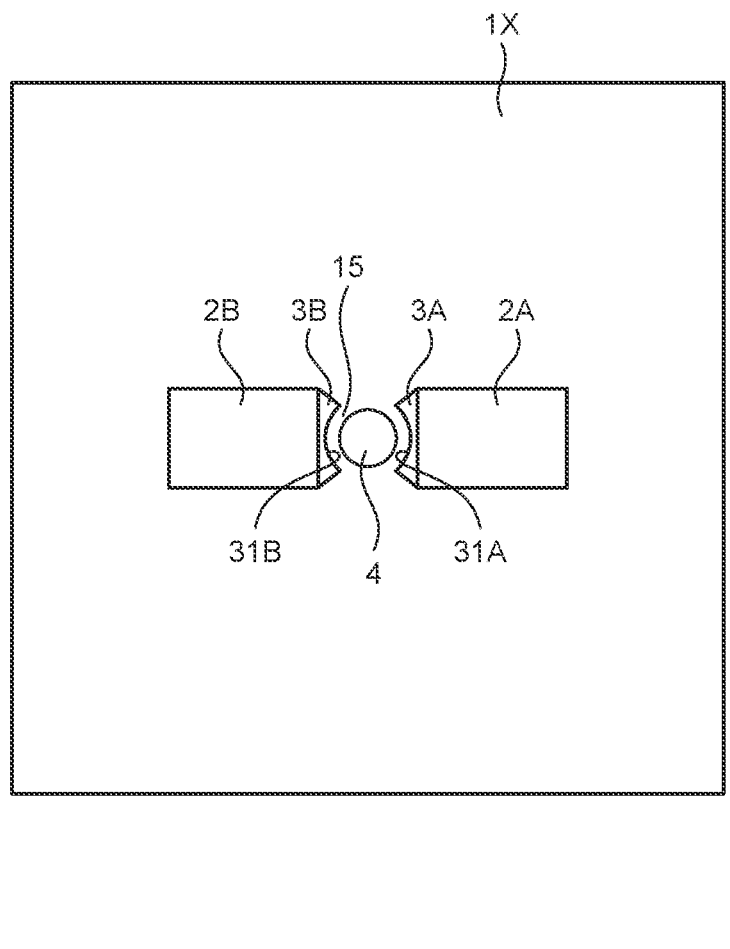
FIG. 2 is a diagram illustrating a state in which an adhesive is applied to the printed wiring board of FIG. 1.
Figure 2:
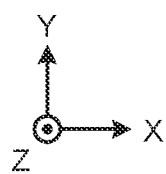

FIG. 1 is a top view illustrating a configuration of a printed wiring board according to a first embodiment. FIG. 2 is a diagram illustrating a state in which an adhesive is applied to the printed wiring board of FIG. 1. In each of FIGS. 1 and 2, and FIGS. 3, 4, and 8, which will be described later, the rightward direction on the drawing sheet will be referred to as an X-axis direction, the vertical direction on the drawing sheet will be referred to as a Y-axis direction, and the direction perpendicular to the drawing sheet will be referred to as a Z-axis direction in the description of the configuration of a printed wiring board 1X.

Electrode pads 2A and 2B for bonding an electronic component 5, which will be described later, are disposed on the top face of the printed wiring board 1X. The electrode pads 2A and 2B each have a rectangular top face with two sides extending in the X-axis direction and two sides extending in the Y-axis direction. The electrode pads 2A and 2B are arranged on the printed wiring board 1X in such a manner that one side of the electrode pad 2A extending in the Y-axis direction and one side of the electrode pad 2B extending in the Y-axis direction face each other with a gap area 15 therebetween. An adhesive 4 for adhering the electronic component 5 is placed at a central area of the gap area 15. For bending of the electronic component 5 onto the printed wiring board 1X, the electrode pad 2A and the electrode pad 2B are bridged by the electronic component 5, and the electronic component 5 is pressed onto the adhesive 4 so that the electronic component 5 is adhered to the adhesive 4.

Barrier conductors 3A and 3B, which are barriers against the adhesive 4 being pressed and spread by the electronic component 5, are formed adjacent to the electrode pads 2A and 2B, respectively. The barrier conductor 3A prevents the adhesive 4 from spreading onto the electrode pad 2A, and prevents solder from spreading onto an end of an electrode 51A (an electrode end 57A, which will be described later). The barrier conductor 3B prevents the adhesive 4 from spreading onto the electrode pad 2B, and prevents solder from spreading onto an end of an electrode 51B (an electrode end 57B, which will be described later).

The barrier conductor 3A is continuous with the electrode pad 2A, and the barrier conductor 3B is continuous with the electrode pad 2B. The barrier conductor 3A is located between the gap area 15 and the electrode pad 2A, and the barrier conductor 3B is located between the gap area 15 and the electrode pad 2B. For example, the barrier conductor 3A is formed of the same conductor as and integrally with the electrode pad 2A, and the barrier conductor 3B is formed of the same conductor as and integrally with the electrode pad 2B.

Alternatively, the barrier conductor 3A and the electrode pad 2A may be formed separately from each other. The barrier conductor 3B and the electrode pad 2B may be formed separately from each other. In addition, the barrier conductor 3A and the electrode pad 2A may be conductors of different kinds from each other. In addition, the barrier conductor 3B and the electrode pad 2B may be conductors of different kinds from each other.

The barrier conductors 3A and 3B are arranged to partially surround the gap area 15. The barrier conductors 3A and 3B each have one end having a linear shape and another end having a curved shape. In other words, the barrier conductor 3A has a linear side at one end, and a curved side 31A, which is a side having a curved shape, at another end in the X-axis direction. In addition, the barrier conductor 3B has a linear side at one end, and a curved side 31B, which is a side having a curved shape, at another end in the X-axis direction. The linear side of the barrier conductor 3A is bonded to a side of the electrode pad 2A extending in the Y-axis direction, and the linear side of the barrier conductor 3B is bonded to a side of the electrode pad 2B extending in the Y-axis direction. In addition, the curved side 31A of the barrier conductor 3A and the curved side 31B of the barrier conductor 3B face each other with the gap area 15 therebetween.

For example, the curved side 31A of the barrier conductor 3A is a circular arc that is equidistant from the center of the gap area 15, and the curved side 31B of the barrier conductor 3B is a circular arc that is equidistant from the center of the gap area 15. In this case, because the curved sides 31A and 31B are not parallel, the distance between the curved sides 31A and 31B differs depending on the positions on the curved sides 31A and 31B.

The distance in the X-axis direction between the curved sides 31A and 31B is longest (the longest distance L2) between the center of the curved side 31A and the center of the curved side 31B. The distance in the X-axis direction between the curved sides 31A and 31B is shortest (the shortest distance L1) between a position of the smallest Y coordinate on the curved side 31A and a position of the smallest Y coordinate on the curved side 31B. Similarly, the distance in the X-axis direction between the curved sides 31A and 31B is shortest (the shortest distance L1) between a position of the largest Y coordinate on the curved side 31A and a position of the largest Y coordinate on the curved side 31B. Thus, the distance in the X-axis direction between the curved sides 31A and 31B is longest between the center of the curved side 31A and the center of the curved side 31B, and becomes smaller as the positions on the curved sides 31A and 31B are farther from the centers.

The barrier conductor 3A is projected at the positions at the shortest distance L1 as viewed from above. The barrier conductor 3B is projected at the positions at the shortest distance L1 as viewed from above.

As described above, the gap area 15 surrounded by the curved sides 31A and 31B is provided to have a specific distance from the center of the gap area 15. The adhesive 4 is applied to the center of the gap area 15, which is a circular area, by a given method. The center of the gap area 15 corresponds to the center of an area in which the electronic component 5 is installed.

Note that the curved sides 31A and 31B are not limited to circular arcs and may be curves such as elliptical arcs. Alternatively, multi-sided shapes connecting a plurality of linear sides may be used instead of the curved sides 31A and 31B. In this case, the sides are arranged along the curves.

Figure 3:
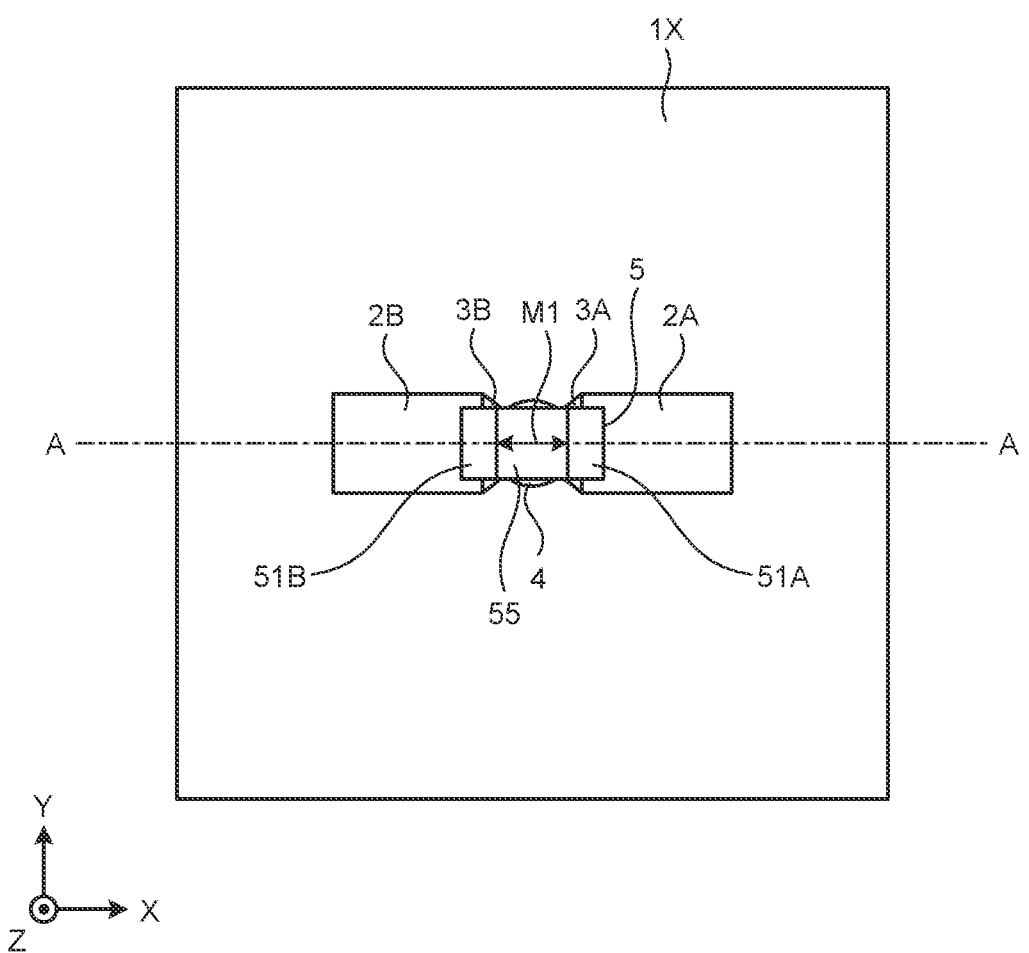
FIG. 3 is a diagram illustrating a state in which an electronic component is installed on the printed wiring board of FIG. 2.

FIG. 3 is a diagram illustrating a state in which an electronic component is installed on the printed wiring board of FIG. 2. The electronic component 5 is a surface mount component mounted on the surface of the printed wiring board 1X. The electronic component 5 in the form of a chip has a rectangular top face with two sides extending in the X-axis direction and two sides extending in the Y-axis direction.

The electronic component 5 includes the electrode 51A soldered to the electrode pad 2A of the printed wiring board 1X, and the electrode 51B soldered to the electrode pad 2B of the printed wiring board 1X. In the electronic component 5, the electrode 51A is located at one end, and the electrode 51B is located at the other end. A central part 55 between the electrode 51A and the electrode 51B has a surface formed from an insulating member. The electronic component 5 is thus constituted by the central part 55 having a surface formed from an insulating member, and the electrodes 51A and 51B located at positions facing each other with the central part 55 therebetween. An inter-electrode distance, which is the distance between the electrodes 51A and 51B, is an inter-electrode distance M1. Thus, the distance (size) of the central part 55 in the X-axis direction in FIG. 3 is the inter-electrode distance M1.

The electronic component 5 is placed on the printed wiring board 1X in such a manner that at least part, of the electrode 51A overlaps with the electrode pad 2A, at least part of the electrode 51B overlaps with the electrode pad 2B, at least part, of the electrode 51A overlaps with the adhesive 4, and at least part of the electrode 51B overlaps with the adhesive 4.

The longest distance L2 between the barrier conductors 3A and 3B is equal to or longer than the inter-electrode distance M1. The adhesive 4 is pressed and spread by the electronic component 5. Note that the barrier conductors 3A and 3B have such sizes and shapes that the curved sides 31A and 31B can be covered by the electronic component 5. The electronic component 5 is then positioned on the barrier conductors 3A and 3B such that the curved sides 31A and 31B are covered by the electronic component 5. Specifically, the electronic component 5 is positioned such that the positions of the barrier conductors 3A and 3B at the shortest distance L1 and at the longest distance L2 are within the outline of the electronic component 5.

The printed wiring board 1X has a through-hole into which an insertion component (not illustrated) is inserted from the rear side of the printed wiring board 1X. The insertion component will be described later.

As described above, the printed wiring board 1X includes the electrode pad 2A (first electrode pad) to be soldered to the electrode 51A (first electrode) of the electronic component 5, the electrode pad 2B (second electrode pad) to be soldered to the electrode 51B (second electrode) of the electronic component 5, the barrier conductor 3A (first barrier conductor) continuous with the electrode pad 2A, and the barrier conductor 3B (second barrier conductor) continuous with the electrode pad 2B. In addition, the barrier conductor 3A and the barrier conductor 3B are located at the positions facing each other with the gap area 15 (adhesive area), in which the adhesive 4 is placed when the electronic component 5 is adhered, therebetween, and the electrodes 51A and 51B are positioned such that the electrode pad 2A faces the gap area 15 with the barrier conductor 3A therebetween and the electrode pad 2B faces the gap area 15 with the barrier conductor 3B therebetween.

Figure 4:
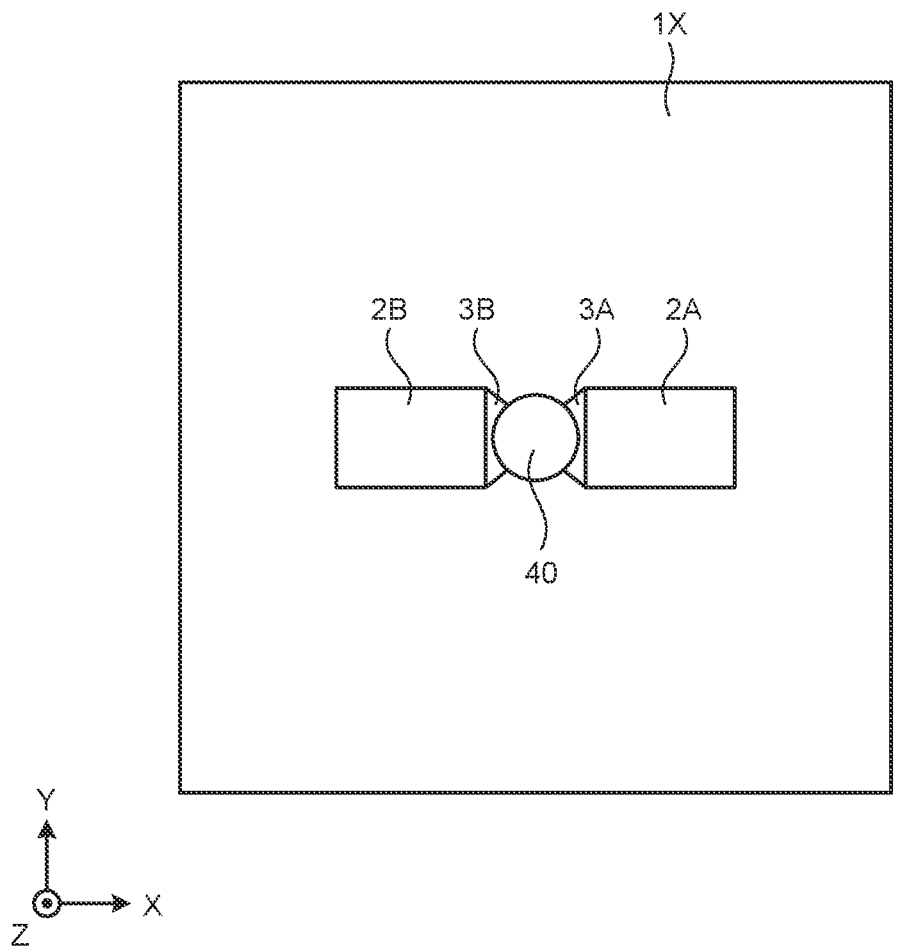
FIG. 4 is a diagram for explaining a state of the adhesive when the electronic component is removed from the printed wiring board in FIG. 3.

FIG. 4 is a diagram for explaining a state of the adhesive when the electronic component is removed from the printed wiring board in FIG. 3. When the adhesive 4 is pressed and spread by the electronic component 5, the adhesive 4 spreads in the gap area 15. Because the barrier conductors 3A and 3B are formed outside the gap area 15, the spreading of the adhesive 4 is stopped by the barrier conductors 3A and 3B and does not reach the electrode pads 2A and 2B. The adhesive 4 pressed and spread by the electronic component 5 and stopped by the barrier conductors 3A and 3B will be referred to as a squeezed adhesive 40.

Wave soldering (flow soldering) is performed on the printed wiring board 1X on which the electronic component 5 and the insertion component are positioned.

Figure 5:
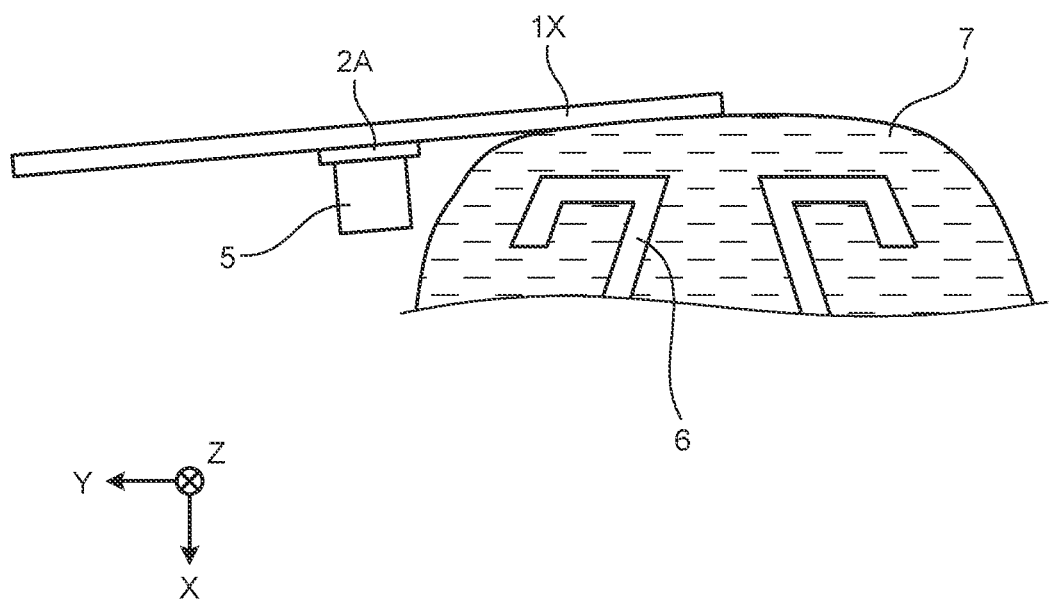
FIG. 5 is a diagram illustrating a state of soldering on the printed wiring board in FIG. 3.

FIG. 5 is a diagram illustrating a state of soldering on the printed wiring board in FIG. 3. FIG. 5 illustrates a side view of the printed wiring board 1X. Note that the insertion component inserted in the through-hole is not illustrated in FIG. 5 and in FIG. 6, which will be described later.

After the adhesive 4 is applied to the printed wiring board 1X and the electronic component 5 is placed on the adhesive 4, the insertion component is inserted. The printed wiring board 1X is put into wave soldering equipment 6 that performs wave soldering. The wave soldering equipment 6 performs wave soldering on the printed wiring board 1X by jetting molten solder 7 through a jet nozzle. In this manner, the wave soldering equipment 6 performs soldering by dipping the electronic component 5 temporarily fixed by the adhesive 4 into the molten solder 7.

Figure 6:
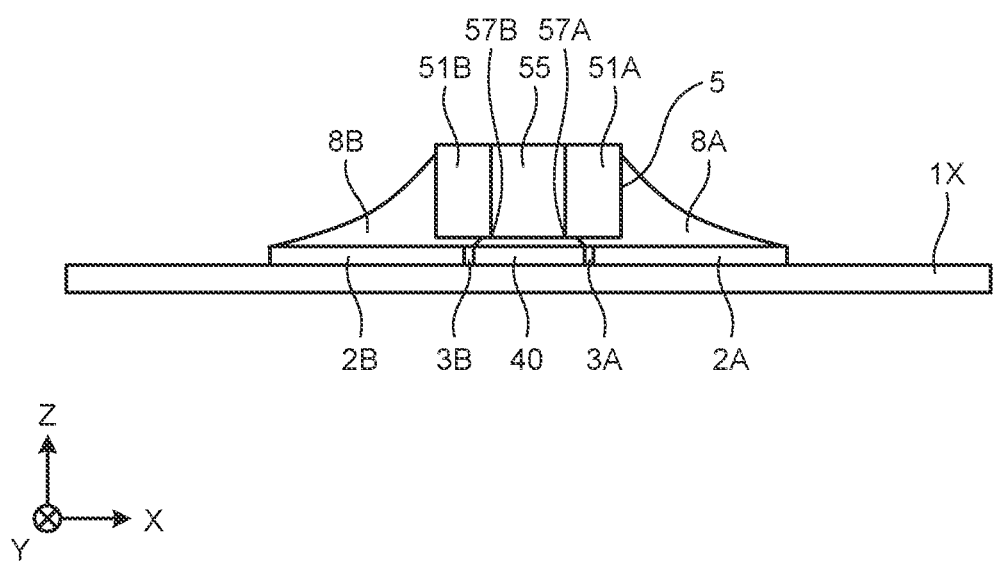
FIG. 6 is a diagram illustrating a structure of the printed wiring board after soldering performed on the printed wiring board in FIG. 3.

FIG. 6 is a diagram illustrating a structure of the printed wiring board after soldering performed on the printed wiring board in FIG. 3. FIG. 6 illustrates a cross-sectional view along A-A of the printed wiring beard 1X illustrated in FIG. 3. As a result of the wave soldering on the printed wiring board 1X, the electrode 51A of the electronic component 5 and the electrode pad 2A of the printed wiring board 1X are connected to each other by solder 8A. In addition, the electrode 51B of the electronic component 5 and the electrode pad 2B of the printed wiring board 1X are connected to each other by solder 8B.

Because the squeezed adhesive 40 spreads to the barrier conductors 3A and 3B, the electrode ends 57A and 57B of a face (bottom face) of the electronic component 5 that comes in contact with the printed wiring board 1X are not soldered. The electrode end 57A is a boundary between a center position of the barrier conductor 3A and the central part 55, and the electrode end 57B is a boundary between a center position of the barrier conductor 3B and the central part 55.

As described above, in the first embodiment, the electrode pads 2A and 2B and the barrier conductors 3A and 3B continuous with the electrode pads 2A and 2B, respectively, are formed on the surface of the printed wiring board 1X. In addition, the longest distance L2 between the barrier conductors 3A and 3B is equal to or longer than the inter-electrode distance M1 of the electronic component 5 to be installed. The adhesive 4 is applied to the center of the printed wiring board 1X between the electrode pads 2A and 2B, and the electronic component 5 is placed directly on the adhesive 4. As a result, the adhesive 4 is pressed and spread and thus becomes the squeezed adhesive 40. Because the squeezed adhesive 40 is prevented from flowing onto the electrode pads 2A and 2B by the barrier conductors 3A and 3B, the squeezed adhesive 40 does not hinder the subsequent soldering. Specifically, the squeezed adhesive 40 does not hinder the connection of the barrier conductor 3A and the electrode pad 2A by the solder 8A, and does not hinder the connection of the barrier conductor 3B and the electrode pad 2B by the solder 8B. Because the barrier conductors 3A and 3B prevent hindering of soldering (metal junction) as described above, the soldering quality of the printed wiring board 1X can be prevented from lowering.

In addition, because the longest distance L2 is equal to or longer than the inter-electrode distance M1, the adhesive 4 adheres to the electrode ends 57A and 57B on the bottom face of the electronic component 5. Thus, as illustrated in FIG. 6, the solder 8A and 8B does not adhere to the electrode ends 57A and 57B. As a result, even when the printed wiring board 1X is deformed after soldering, a crack from the electrode ends 57A and 57B on the bottom face of the electronic component 5 into the electronic component 5 can be prevented.

In addition, the barrier conductors 3A and 3B are positioned such that the positions at the shortest distance L1 (a first position on the barrier conductor 3A and a second position on the barrier conductor 3B) are within the outline (within the area of the bottom face) of the electronic component 5. The first position on the barrier conductor 3A corresponds to the projecting region when the barrier conductor 3A is viewed from above, and the second position on the barrier conductor 3B corresponds to the projecting region when the barrier conductor 3B is viewed from above. This structure enables the projecting regions at the shortest distance L1 and the electrodes 51A and 51B of the electronic component 5 to easily overlap with each other even when the installing position of the electronic component 5 in the X-axis direction varies. The projecting regions of the barrier conductors 3A and 3B at the shortest distance L1 are regions that are rigidly connected with the electrodes 51A and 51B. Thus, the structure in which the projecting regions at the shortest distance L1 are within the outline of the electronic component 5 achieves rigid connection between the electrode 51A and the barrier conductor 3A and rigid connection between the electrode 51B and the barrier conductor 3B.

Note that, in a case where the gap between the electrode pads on the printed wiring board is simply widened, when the installing position of the electronic component is displaced, the electrodes of the electronic component come out of the electrode pads of the printed wiring board, and cannot be soldered.

In a case where the gap between the electrode pads on the printed wiring board is simply narrowed, deformation of the printed wiring board occurring after soldering may cause a crack from an electrode end on the bottom face of the electronic component into the electronic component.

Furthermore, in a case where a barrier pattern or the like independent of the electrode pads is used between the electrode pads on the printed wiring board to stop the spreading of the adhesive, it is difficult to meet the constraint of minimum spacing (line and space) between conductors and non-conductors on the printed wiring board. In addition, a short circuit is likely to occur between the electrode pads via the barrier pattern during soldering. As a result, the soldering quality lowers, and the insulation reliability lowers.

Figure 7:
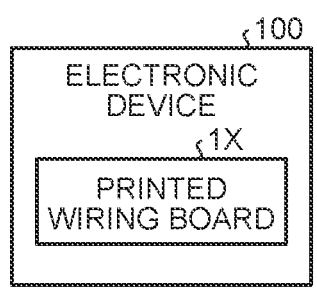
FIG. 7 is a diagram illustrating a configuration of an electronic device including the printed wiring board according to the first embodiment.

FIG. 7 is a diagram illustrating a configuration of an electronic device including the printed wiring beard according to the first embodiment. The printed wiring board 1X illustrated in FIG. 6 is installed on the electronic device 100. On the printed wiring board 1X included in the electronic device 100, the electronic component 5 and the insertion component are connected by soldering as described above.

As described above, in the first embodiment, the electrode pad 2A, the barrier conductor 3A continuous with the electrode pad 2A, the electrode pad 2B, and the barrier conductor 3B continuous with the electrode pad 2B are formed between the electrode pads 2A and 2B on the printed wiring board 1X. As a result, the electrode pads 2A and 2B can stop the spreading of the adhesive 4. In addition, because a large gap area 15 can be provided, a short circuit between the electrode pads 2A and 2B can be prevented. It is therefore possible to stop the spreading of the adhesive 4 while preventing a short circuit between the electrode pads 2A and 2B.

Second Embodiment

Next, a second embodiment of the present invention will be described with reference to FIG. 8. In the second embodiment, resins are formed on the top faces of the barrier conductors 3A and 3B to increase the heights of the barriers for preventing the adhesive 4 from being extruded and spreading out.

Figure 8:
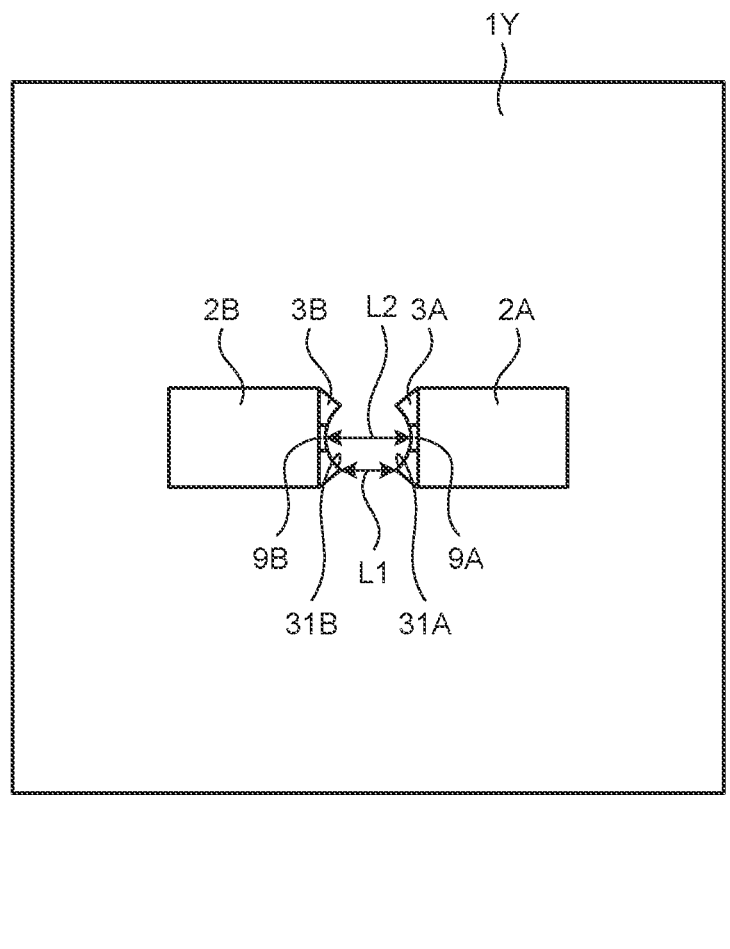
FIG. 8 is a top view illustrating a configuration of a printed wiring board according to a second embodiment.

FIG. 8 is a top view illustrating a configuration of a printed wiring board according to the second embodiment. Components that have the same functions as those of the printed wiring board 1X of the first embodiment illustrated in FIG. 1 among the components in FIG. 8 will be represented by the same reference numerals and redundant description thereof will not be repeated.

As compared with the printed wiring board 1X, a printed wiring board 1Y of the second embodiment includes a resin 9A formed on the barrier conductor 3A and a resin 9B formed on the barrier conductor 3B. The resin 9A is laid over the center of the top face of the harrier conductor 3A, and the resin 9B is laid over the center of the top face of the barrier conductor 3B. Thus, the resins 9A and 9B are located at positions on the top faces of the barrier conductors 3A and 3B at the longest distance L2. Note that the resin 9A may be laid over the entire top face of the barrier conductor 3A or part of the top face thereof. The resin 9B may be laid over the entire top face of the barrier conductor 3B or part of the top face thereof.

The resins 9A and 9B are a subsidiary material used in manufacturing of the printed wiring board 1Y. Examples of the resins 9A and 9B include solder resists and symbol printing ink. The resins 9A and 9B may be formed of only one layer or a plurality of layers.

As described above, because the resins 9A and 9B are located at the positions on the barrier conductors 3A and 3B at the longest distance L2 on the printed wiring board 1Y, the heights of the barriers are increased. The effect of preventing the squeezed adhesive 40 from spreading onto the electrode pads 2A and 2B is therefore enhanced as compared with the printed wiring board 1X.

In addition, examples of the method for applying the adhesive 4 in the first and second embodiments include a method of transferring the adhesive 4 by using a metal mask by a printer in a manner similar to solder paste printing, a method of transferring the adhesive 4 by using a nozzle by an adhesive dispenser, and a method of discharging and applying the adhesive 4 to the printed wiring board 1X or 1Y by a jet dispenser.

In addition, for the printed wiring boards 1X and 1Y used in the first and second embodiments, an insulating material, such as a glass woven fabric, a nonwoven glass fabric, or a paper base, that is impregnated with epoxy resin, polyimide resin, phenol resin, or the like is used.

Furthermore, for the material of the molten solder 7 used in the first and second embodiments, a solder alloy (Sn-3Ag-0.5Cu) containing 3 mass % of Ag (silver), 0.5 mass % of Cu (copper), the balance being Sn (tin) with inevitable impurities, can be used, for example. Note that the material of the molten solder 7 is not limited thereto, and any of Sn—Cu based solder, Sn—Bi (bismuth) based solder, Sn—In (indium) based solder, Sn—Sb (antimony) based solder, and Sn—Pb (lead) based solder may be used.

As described above, in the second embodiment, because the resins 9A and 9B are formed on the top faces of the barrier conductors 3A and 3B, the heights of the barriers for preventing the adhesive 4 from being extruded and spreading out are increased. As a result, the effect of preventing the adhesive 4 from spreading onto the electrode pads 2A and 2B can be enhanced. In addition, the effect of preventing the solders 8A and 8B from spreading onto the electrode ends 57A and 57B can be enhanced.

The configurations presented in the embodiments above are examples of the present invention, and can be combined with other known technologies or can be partly omitted or modified without departing from the scope of the present invention.

REFERENCE SIGNS LIST 1X, 1Y printed wiring board; 2A, 2B electrode pad; 3A, 3B barrier conductor; 4 adhesive; 5 electronic component; 6 wave soldering equipment; 9A, 9B resin; 15 gap area; 31A, 31B curved side; 40 squeezed adhesive; 51A, 51B electrode; 55 central part; 57A, 57B electrode end; 100 electronic device.

The invention claimed is:

1. A printed wiring board comprising:
a first electrode pad to be soldered to a first electrode of an electronic component;
a second electrode pad to be soldered to a second electrode of the electronic component;
a first barrier conductor continuous with the first electrode pad; and
a second barrier conductor continuous with the second electrode pad, wherein
the first barrier conductor and the second barrier conductor are located at positions facing each other with an adhesive area therebetween, and the first electrode pad and the second electrode pad are positioned such that the first electrode pad faces the adhesive area with the first barrier conductor therebetween and that the second electrode pad faces the adhesive area with the second barrier conductor therebetween, the adhesive area being an area for an adhesive to be placed for adhesion of the electronic component, and
a longest distance between the first barrier conductor and the second barrier conductor in a direction of arrangement of the first electrode pad and the second electrode pad is equal to or longer than an inter-electrode distance, the inter-electrode distance being a distance between the first electrode and the second electrode.

2. The printed wiring board according to claim 1, wherein the first barrier conductor and the second barrier conductor are arranged to partially surround the adhesive area.

3. The printed wiring board according to claim 1, wherein a first position of the first barrier conductor at which a distance between the first barrier conductor and the second barrier conductor in the direction of arrangement of the first electrode pad and the second electrode pad is shortest, and a second position of the second barrier conductor at which a distance between the first barrier conductor and the second barrier conductor in the direction of arrangement of the first electrode pad and the second electrode pad is shortest are within an area of a bottom face of the electronic component when the electronic component is installed.

4. The printed wiring board according to claim 1, wherein a resin is formed on a top face of the first barrier conductor and a top face of the second barrier conductor.

5. The printed wiring board according to claim 4, wherein the resin is solder resist or symbol printing ink.

6. The printed wiring board according to claim 1, wherein the first barrier conductor is a same conductor as the first electrode pad and formed integrally with the first electrode pad, and the second barrier conductor is a same conductor as the second electrode pad and formed integrally with the second electrode pad.

7. An electronic device comprising the printed wiring board according to claim 1.

* * * * *